(12) United States Patent
Jin et al.

(10) Patent No.: US 9,076,905 B2
(45) Date of Patent: Jul. 7, 2015

(54) SEMICONDUCTOR DEVICE AND METHOD FOR MANUFACTURING THE SAME

(71) Applicant: LG ELECTRONICS INC., Seoul (KR)

(72) Inventors: Yoonsil Jin, Seoul (KR); Goohwan Shim, Seoul (KR); Youngho Choe, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/041,907

(22) Filed: Dec. 18, 2013

(65) Prior Publication Data

US 2014/0099747 A1 Apr. 10, 2014

Related U.S. Application Data

(62) Division of application No. 12/942,004, filed on Nov. 8, 2010, now Pat. No. 8,552,520.

(30) Foreign Application Priority Data

Sep. 27, 2010 (KR) .................. 10-2010-0093108

(51) Int. Cl.
*H01L 21/00* (2006.01)
*H01L 31/0236* (2006.01)
*H01L 31/0216* (2014.01)
*H01L 31/0224* (2006.01)
*H01L 31/068* (2012.01)
*H01L 31/18* (2006.01)

(52) U.S. Cl.
CPC .... *H01L 31/02366* (2013.01); *H01L 31/02168* (2013.01); *H01L 31/022425* (2013.01); *H01L 31/068* (2013.01); *Y02E 10/547* (2013.01); *H01L 31/18* (2013.01); *H01L 31/02363* (2013.01); *H01L 31/1804* (2013.01)

(58) Field of Classification Search
CPC .............. H01L 25/043; H01L 27/1422; H01L 27/1423; H01L 27/1428; H01L 31/042; H01L 31/02168
USPC .............. 438/48, 57, 66, 689, 690, 735, 739; 257/460, E25.009; 136/255, 256, 461, 136/462
See application file for complete search history.

(56) References Cited

U.S. PATENT DOCUMENTS

| | | |
|---|---|---|
| 2008/0006319 A1 | 1/2008 | Bettge et al. |
| 2009/0014056 A1 | 1/2009 | Hockaday |
| 2009/0101202 A1 | 4/2009 | Sun et al. |
| 2010/0018580 A1 | 1/2010 | Habermann et al. |
| 2010/0024871 A1* | 2/2010 | Oh et al. ............... 136/255 |

(Continued)

FOREIGN PATENT DOCUMENTS

| | | |
|---|---|---|
| JP | S63234566 A | 9/1988 |
| JP | 09-199742 A | 7/1997 |

(Continued)

*Primary Examiner* — Brook Kebede
(74) *Attorney, Agent, or Firm* — McKenna Long & Aldridge LLP (57) ABSTRACT

A semiconductor device includes a substrate and a first insulating layer. The first insulating layer includes a first lower layer and a first upper layer on the first lower layer. The first insulating layer has a first opening through the first lower layer and the first upper layer. A maximum width of the first opening at the first lower layer is different from a maximum width of the first opening at the first upper layer.

19 Claims, 4 Drawing Sheets

(56) References Cited

U.S. PATENT DOCUMENTS

2010/0065117 A1 3/2010 Kim et al.
2010/0243040 A1* 9/2010 Kim .............................. 136/255
2010/0275987 A1 11/2010 Sakamoto et al.

FOREIGN PATENT DOCUMENTS

| JP | H1041531 A | 2/1998 |
| JP | H1117202 A | 1/1999 |
| KR | 10-2010-0026463 A | 3/2010 |

\* cited by examiner

SEMICONDUCTOR DEVICE AND METHOD FOR MANUFACTURING THE SAME

This application is a Divisional Application of allowed application Ser. No. 12/942,004 filed Nov. 8, 2010 which claims the benefit of priority of Korean Application No. 10-2010-0093108 filed in the Korean Patent Office on Sep. 27, 2010, all of which are incorporated by reference in their entirety herein.

BACKGROUND

1. Field of the Invention

Exemplary embodiments of the invention relates to semiconductor devices and methods for manufacturing the same.

2. Description of the Related Art

A solar cell converts light energy into electrical energy using the photoelectric effect. Solar power generation using solar cells has been widely used for obtaining environmentally friendly energy. Solar power generation systems using solar cell modules have been increasingly installed on houses due to improvements in efficiencies of solar cells.

A first related art solar cell includes a substrate and an emitter layer that forms a p-n junction with the substrate, thereby generating an electric current using light incident on one surface of the substrate. However, electric current is only generated by the light incident on the one surface of the substrate.

A second related solar cell is a double-sided solar cell, for which electric current is generated using light incident on two opposing surfaces of the solar cell.

SUMMARY

Accordingly, the present invention is directed to semiconductor devices and methods of manufacturing the same that substantially obviate one or more of the problems due to limitations and disadvantages of the related art.

Therefore, an advantage of the present invention is to provide a semiconductor device capable of having a maximum width of an opening at a lower portion different from a maximum width of an opening at an upper portion.

To achieve these and other advantages and in accordance with the purpose of the present invention, as embodied and broadly described herein, there is provided a semiconductor device, including: a substrate; and a first insulating layer on a first surface of the substrate, the first insulating layer including a first lower layer and a first upper layer on the first lower layer, the first insulating layer having a first opening through the first lower layer and the first upper layer, wherein a maximum width of the first opening at the first lower layer is different from a maximum width of the first opening at the first upper layer.

In another aspect, a method for manufacturing a semiconductor device includes: forming an insulating layer on a substrate by forming a lower layer on the substrate and forming an upper layer on the lower layer, wherein a material of the upper layer is different than a material of the lower layer; and patterning the insulating layer to form an opening in the insulating layer, wherein the patterning of the insulating layer includes: dry etching the upper layer using a laser; and wet etching the lower layer using the upper layer as a mask.

In yet another aspect, a method for manufacturing a semiconductor device includes: forming an emitter layer at a front surface of a substrate for a solar cell; forming a back surface field layer at a back surface of the substrate; forming a front anti-reflection layer, including forming at least a first lower layer and an first upper layer on the emitter layer; forming a back anti-reflection layer, including forming at least a second lower layer and a second upper layer on the back surface field layer; forming a plurality of first openings in the front anti-reflection layer; forming a plurality of second openings in the back anti-reflection layer; forming a plurality of first electrodes on portions of the emitter layer exposed through the plurality of first openings; and forming a plurality of second electrodes on portions of the back surface field layer exposed through the plurality of second openings, wherein the steps of forming the plurality of first and second openings includes: dry etching the first upper layer and the second upper layer; and wet etching the first lower layer and the second lower layer using the first upper layer and the second upper layer as masks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Figure 1:
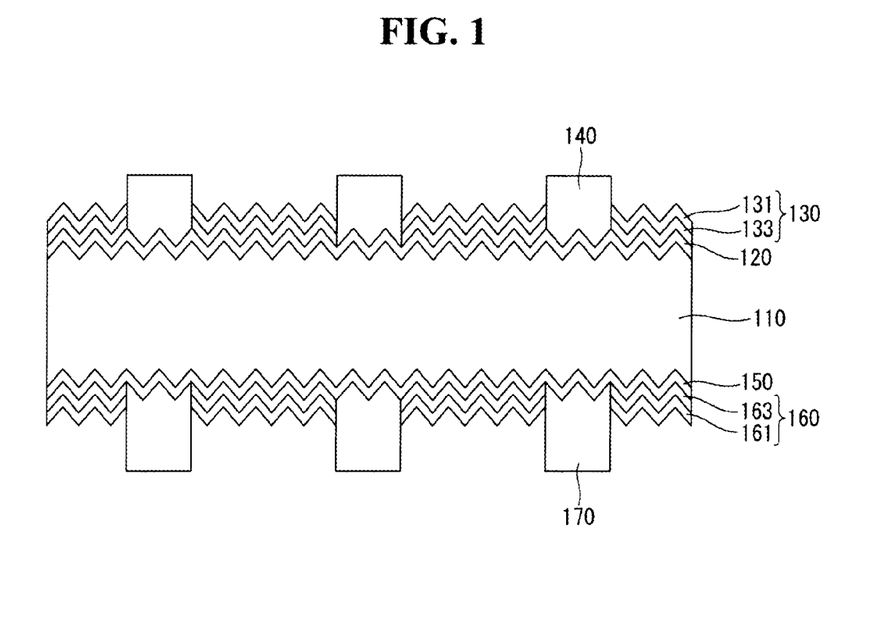
FIG. 1 illustrates a schematic cross-sectional view of a semiconductor device according to an exemplary embodiment.
Figure 2:
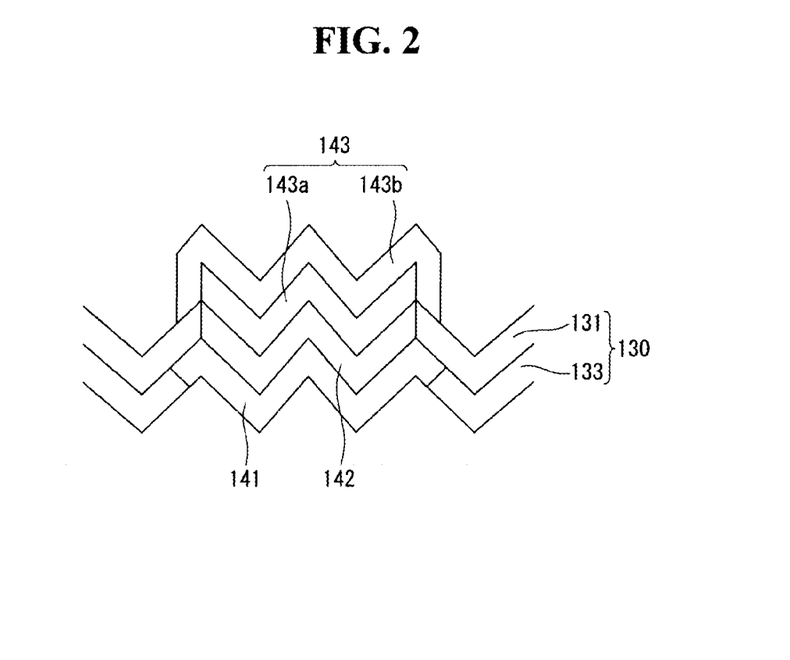
FIG. 2 illustrates an enlarged schematic cross-sectional view of a portion of the semiconductor device shown in FIG. 1.
Figure 5:
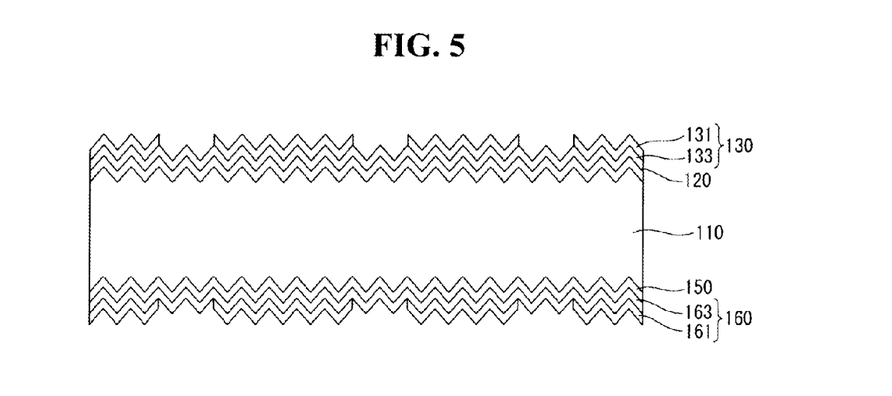
Figure 6:
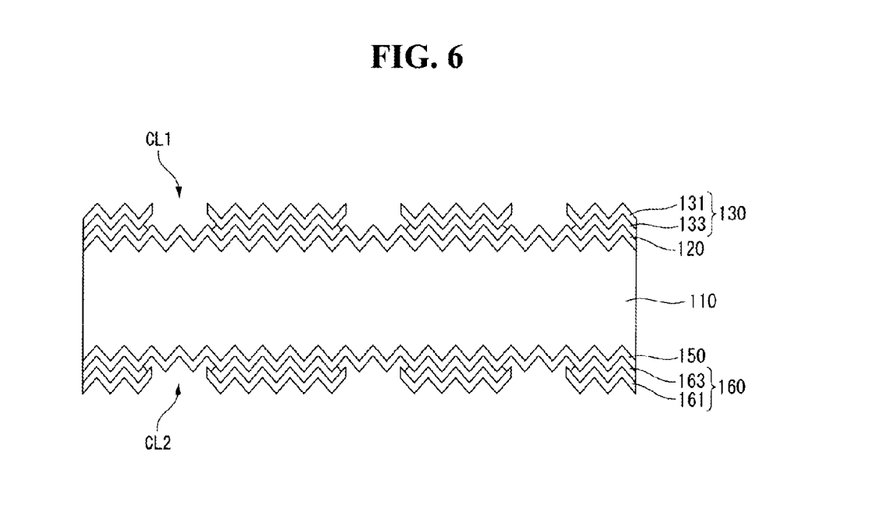
Figure 7:
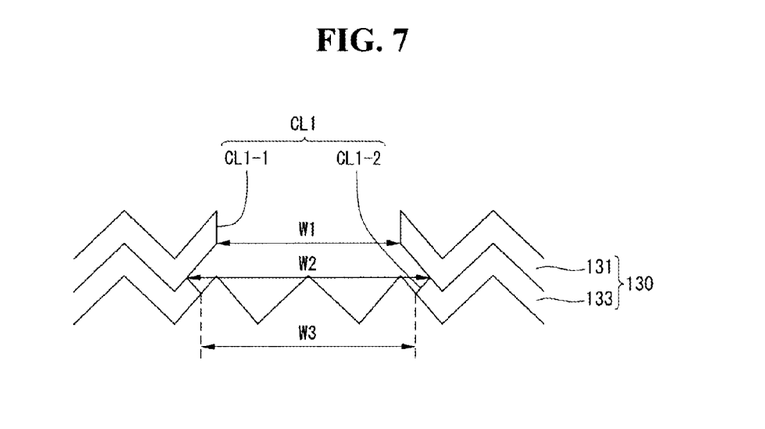
FIGS. 7 and 8 illustrate enlarged schematic cross-sectional views of a portion of the semiconductor device shown in FIG. 6.
Figure 8:
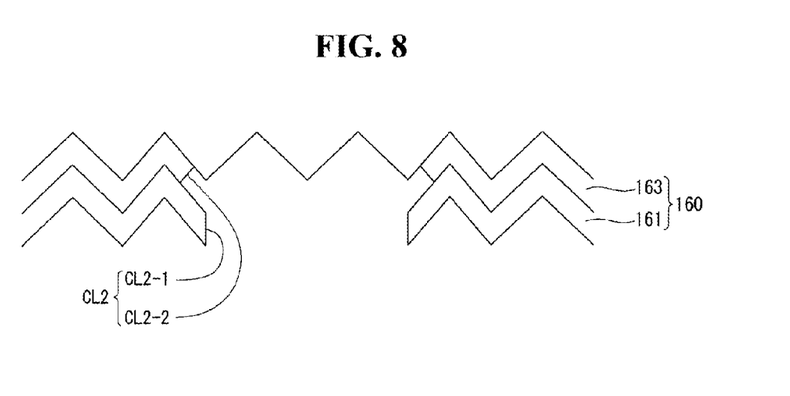

FIG. 1 illustrates a schematic cross-sectional view of a semiconductor device according to an exemplary embodiment. FIG. 2 illustrates an enlarged schematic cross-sectional view of a portion of the semiconductor device shown in FIG. 1. FIGS. 3 to 6 illustrate schematic cross-sectional views sequentially illustrating a method for manufacturing the semiconductor device shown in FIG. 1. FIGS. 7 and 8 illustrate enlarged schematic cross-sectional views of a portion of the semiconductor device shown in FIG. 6.

A semiconductor device 100 may include a substrate 110 and a first insulating layer 130. The first insulating layer 130 may be on a first surface of the substrate 110, such as a front surface. The first insulating layer 130 may be positioned on portions of the substrate 110 and not positioned on other portions of the substrate 110, forming openings in the first insulating layer 130. A maximum width of a lower portion of an opening in the first insulating layer 130 may be different than a maximum width of an upper portion of the opening in the first insulating layer 130. For example, the maximum width of the lower portion of the opening in the first insulating layer 130 may be greater than a maximum width of the upper portion of the opening in the first insulating layer 130.

In one embodiment, the first insulating layer 130 may include at least two layers positioned on the first surface of the substrate 110, and the opening may be formed in a lower layer 133 and an upper layer 131. A maximum width of the opening in the lower layer 133 may be different than a maximum width of the opening in the upper layer 131. For example, the maximum width of the opening in the lower layer 133 may be greater than the maximum width of the opening in the upper layer 131.

The semiconductor device 100 may include a plurality of first electrodes 140. The plurality of first electrodes 140 may be positioned in the openings in the first insulating layer 130, respectively.

The semiconductor device 100 may further include a second insulating layer 160 positioned on a second surface of the substrate 110, such as a back surface. The second insulating layer 160 may be positioned on portions of the substrate 110 and not positioned on other portions of the substrate 110, forming openings in the second insulating layer 160.

The semiconductor device 100 may include a plurality of second electrodes 170. The plurality of second electrodes 170 may be positioned in the openings in the second insulating layer 160, respectively.

The semiconductor device 100 may function, for example, as a solar cell 100. The solar cell 100 may include an emitter layer 120, which may be positioned at the front surface of the substrate 110. In one aspect, the emitter layer 120 may be formed in the front surface of the substrate 110 by, for example, doping.

The first insulating layer 130 may be positioned on the emitter layer 120 and may function as a front anti-reflection layer 130. The plurality of first electrodes 140 may be positioned on the emitter layer 120, such as at the openings in the front anti-reflection layer 130.

The solar cell 100 may include a back surface field (BSF) layer 150, which may be positioned at the back surface of the substrate 110. In one aspect, the back surface field (BSF) layer 150 may be formed in the back surface of the substrate 110 by, for example, doping.

The second insulating layer 160 may be positioned on the BSF layer 150 and may function as a back anti-reflection layer 160. The plurality of second electrodes 170 may be positioned on the BSF layer 150, such as at the openings in the back anti-reflection layer 160.

The substrate 110 may be formed of a silicon wafer or may be formed of other semiconductor materials other than silicon, and the substrate 110 may be of a first conductive type, such as n-type, or a second-conductive type, such as p-type.

Silicon used in the substrate 110 may be crystalline silicon, such as single crystal silicon or polycrystalline silicon, or may be amorphous silicon.

If substrate 110 is n-type silicon, the substrate 110 may contain impurities of a group V element, such as phosphorus (P), arsenic (As), and antimony (Sb). If substrate 110 is p-type silicon, the substrate 110 may contain impurities of a group III element, such as boron (B), gallium (Ga), and indium (In).

The surface of the substrate 110 may be textured to form a textured surface corresponding to an uneven surface or having uneven characteristics. The substrate 110 may have a first textured surface 111 corresponding to the front surface at which the emitter layer 120 may be positioned and a second textured surface 113 corresponding to the back surface at which the back surface field layer 150 may be positioned.

The emitter layer 120 positioned at the first textured surface 111 of the substrate 110 may be an impurity region of a second conductive type (for example, p-type) opposite the first conductive type (for example, n-type) of the substrate 110. The emitter layer 120 may form a p-n junction along with the substrate 110.

A plurality of electron-hole pairs produced by light incident on the substrate 110 may be separated into electrons and holes by a built-in potential difference resulting from the p-n junction between the substrate 110 and the emitter layer 120. Then, the separated electrons may move to the n-type semiconductor, and the separated holes may move to the p-type semiconductor. Thus, if substrate 110 is n-type and the emitter layer 120 is p-type, the separated electrons and the separated holes may move to the substrate 110 and the emitter layer 120, respectively. Accordingly, the electrons may become major carriers in the substrate 110, and the holes may become major carriers in the emitter layer 120.

If emitter layer 120 is p-type, the emitter layer 120 may be formed by doping the substrate 110 with impurities of a group III element such as B, Ga, and In.

On the contrary, if substrate 110 is p-type, the emitter layer 120 may be n-type. In this case, the separated holes may move to the substrate 110, and the separated electrons may move to the emitter layer 120. If emitter layer 120 is n-type, the emitter layer 120 may be formed by doping the substrate 110 with impurities of a group V element such as P, As, and Sb.

The front anti-reflection layer 130 on the emitter layer 120 at the front surface of the substrate 110 may contain a metal oxide-based material. The front anti-reflection layer 130 may include a first upper layer 131 formed of silicon nitride (SiNx: H) and a first lower layer 133 positioned between the emitter layer 120 and the first upper layer 131.

The first lower layer 133 may be formed of a material (for example, aluminum oxide (AlOx)) that has absorption coefficients or band gaps greatly different from that of silicon nitride (SiNx: H).

The front anti-reflection layer 130 may serve as an anti-reflection layer, which may reduce a reflectance of light incident through the front surface of the substrate 110 and may increase a selectivity of a predetermined wavelength band, and may also serve as a passivation layer.

The first lower layer 133 formed of aluminum oxide (AlOx) may have a refractive index of 1.55 to 1.7 and may have a thickness equal to or less than 50 nm, and the first upper layer 131 formed of silicon nitride (SiNx: H) may have a refractive index of 1.9 to 2.3 and may have a thickness of 50 nm to 100 nm, so as to minimize the light reflectance in the front anti-reflection layer 130.

According to an experiment conducted by the inventors, the light reflectance in the front anti-reflection layer 130 was minimized when the first lower layer 133 was formed of aluminum oxide, the first upper layer 131 was formed of silicon nitride, and each of the layers 133 and 131 were within the above refractive index and thickness ranges.

As the metal oxide-based material used to form the first lower layer 133, silicon nitride (SiNx: H) may be used instead of aluminum oxide (AlOx).

The first upper layer 131 may be formed of aluminum oxide, silicon oxide, silicon oxynitride, or titanium oxide, instead of silicon nitride. In one aspect, the first upper layer 131 and the first lower layer 133 may be formed of different materials.

The front anti-reflection layer 130 may include a plurality of openings exposing a portion of the emitter layer 120. The openings may be a plurality of first contact lines CL1 formed in a line pattern. The first electrodes 140 may be formed on the emitter layer 120 exposed through the first contact lines CL1.

In an exemplary embodiment, a maximum width of the opening positioned in the first lower layer 133 adjacent to the substrate 110 may be different from a maximum width of the opening positioned in the first upper layer 131. Further, a cross-sectional area and an average width of the first opening positioned in the first lower layer 133 may be greater than a cross-sectional area and an average width of the opening positioned in the first upper layer 131.

Each of the plurality of first contact lines CL1 may include a first portion CL1-1 positioned in the first upper layer 131 and a second portion CL1-2 positioned in the first lower layer 133. A maximum width of the first portion CL1-1 may be different from a maximum width of the second portion CL1-2.

The first portion CL1-1 may have a substantially uniform width W1, and the second portion CL1-2 may have a non-uniform width. Namely, a width W2 of the second portion CL1-2 adjacent to the first portion CL1-1 may be greater than a width W3 of the second portion CL1-2 adjacent to the substrate 110. Thus, the maximum width of the first portion CL1-1 is W1, the maximum width of the second portion CL1-2 is W2, and a minimum width of the second portion CL1-2 is W3.

In the structure of the first contact lines CL1, the side surface of the first upper layer 131 exposed by the first portion CL1-1 may be formed in the form of a substantially straight line, and the side surface of the first lower layer 133 exposed by the second portion CL1-2 may be formed in the form of a curved line.

Regarding the shape of the first contact lines CL1, the width W2 of an upper end portion of the second portion CL1-2 may be greater than the width W1 of the first portion CL1-1. Further, a width of an upper end portion of the first portion CL1-1 and a width of a lower end portion of the first portion CL1-1 may be substantially equal to each other, i.e., W1.

The width W2 of the upper end portion of the second portion CL1-2 may be greater than the width W3 of a lower end portion of the second portion CL1-2. The width W3 of the lower end portion of the second portion CL1-2 may be greater than the width W1 of the lower end portion of the first portion CL1-1.

In the exemplary embodiment, the width of the lower end portion of the first portion CL1-1 indicates a separation distance between the first upper layers 131 measured in a lower surface of the first upper layer 131. The width of the upper end portion of the first portion CL1-1 indicates a separation distance between the first upper layers 131 measured in an upper surface of the first upper layer 131. The width W2 of the upper end portion of the second portion CL1-2 indicates a separation distance between the first lower layers 133 measured in an upper surface of the first lower layer 133. The width W3 of the lower end portion of the second portion CL1-2 indicates a separation distance between the first lower layers 133 measured in a lower surface of the first lower layer 133.

Accordingly, a contact surface between the first electrode 140 and the first upper layer 131 may be a substantially flat surface, and a contact surface between the first electrode 140 and the first lower layer 133 may be a curved surface.

The width W2 of the upper end portion of the second portion CL1-2 and the width W3 of the lower end portion of the second portion CL1-2 may be adjusted based on etching conditions of the front anti-reflection layer 130.

The width W1 of the first portion CL1-1 of the first contact line CL1 may be 20 μm to 60 μm, and a plane area of the first portion CL1-1 may be 2% to 6% of a plane area of the emitter layer 120, so that the first electrode 140 may have a narrow width and a high aspect ratio.

If the width W1 of the first portion CL1-1 is within the above range, the first electrode 140 may be formed to have a thickness of 20 μm to 50 μm using a plating process.

According to the above-described structure, the first electrode 140 may have a high aspect ratio of 0.83 to 1, which is a ratio of a height of the first electrode to a contact area between the first electrode and the substrate The first electrodes 140 formed on the emitter layer 120 exposed through the first contact line CL1 may be electrically and physically connected to the emitter layer 120. The first electrodes 140 may extend substantially parallel to one another in a fixed direction. The first electrodes 140 may collect carriers (for example, holes) moving to the emitter layer 120.

In an exemplary embodiment, the first electrode 140 may be formed using a plating layer. The plating layer may include a metal seed layer 141, a diffusion barrier layer 142, and a conductive layer 143 that may be sequentially formed on the emitter layer 120.

The metal seed layer 141 may be formed of a material containing nickel, for example, nickel silicide (such as $Ni_2Si$, $NiSi$, $NiSi_2$, etc.) and may have a thickness of 50 nm to 200 nm.

If the thickness of the metal seed layer 141 is less than 50 nm, a high resistance may be obtained and it may be difficult to form the uniform metal seed layer 141. Thus, it may be difficult to secure the uniformity in a subsequent process, such as in a plating process of the diffusion barrier layer 142. If the thickness of the metal seed layer 141 is greater than 200 nm, the metal seed layer 141 may be distributed to silicon at a constant rate in a thermal process forming a nickel silicide layer. Thus, a shunt leakage may occur because of the distribution of nickel.

The diffusion barrier layer 142 on the metal seed layer 141 may prevent junction degradation caused by a material of the conductive layer 143 being diffused into a silicon interface through the metal seed layer 141. The diffusion barrier layer 142 may be, for example, a nickel layer having a thickness of 5 μm to 15 μm.

The conductive layer 143 on the diffusion barrier layer 142 may be formed of one or more conductive metal materials, such as nickel (Ni), copper (Cu), silver (Ag), aluminum (Al), tin (Sn), zinc (Zn), indium (In), titanium (Ti), gold (Au), or combinations thereof. Other materials may also be used.

In an exemplary embodiment, the conductive layer 143 may include a copper layer 143a. The copper layer 143a may have high conductivity and may have a thickness of 10 μm to 30 μm. However, copper easily oxidizes in air and also is difficult to directly solder to an interconnector, such as a ribbon for electrically connecting adjacent solar cells 100 to the copper layer 143a in a module process. Thus, the conductive layer 143 may further include a tin layer 143b that may prevent oxidization of copper and may aid in smoothly performing a soldering process of the ribbon. The tin layer 143b on the copper layer 143a may have a thickness of 5 μm to 15 μm. The tin layer 143b may also be omitted.

The first electrode 140 may also be formed using a conductive paste containing a conductive material, such as silver (Ag). A method for forming the first electrode 140 using the conductive paste is well known to those skilled in the art.

The back surface field layer 150 may be positioned at a portion of or at the entire back surface of the substrate 110. The back surface field layer 150 may be a region (for example, $n^+$-type region) that is more heavily doped with impurities of the same conductive type as the substrate 110 than the substrate 110.

The movement of holes to the back surface of the substrate 110 may be prevented or reduced by a potential barrier resulting from a difference between impurity concentrations of the substrate 110 and the back surface field layer 150. Hence, a recombination and/or a disappearance of electrons and holes around the surface of the substrate 110 may be prevented or reduced.

The back anti-reflection layer 160 and the second electrodes 170 may be positioned on the back surface of the back surface field layer 150. The back anti-reflection layer 160 may reduce a reflectance of light incident through the back surface of the substrate 110 and may increase a selectivity of a predetermined wavelength band, thereby increasing the efficiency of the solar cell 100. Further, the back anti-reflection layer 160 may serve as a passivation layer.

The back anti-reflection layer 160 may have the same structure as the front anti-reflection layer 130. In other words, the back anti-reflection layer 160 may include a second upper layer 161 formed of silicon nitride (SiNx: H) and a second lower layer 163 that may be positioned between the back surface field layer 150 and the second upper layer 161. The second lower layer 163 may be formed of, for example, aluminum oxide (AlOx) or silicon oxide (SiOx).

The second upper layer 161 and the second lower layer 163 of the back anti-reflection layer 160 may be formed of a material different from the first upper layer 131 and the first lower layer 133 of the front anti-reflection layer 130, respectively.

The back anti-reflection layer 160 may include a plurality of openings exposing a portion of the back surface field layer 150. The openings may be a plurality of second contact lines CL2 formed in a line pattern. The second electrodes 170 may be formed on the back surface field layer 150 exposed through the second contact lines CL2.

The second contact line CL2 may have the same structure as the first contact line CL1. Thus, each of the plurality of second contact lines CL2 may include a third portion CL2-1 positioned in the second upper layer 161 and a fourth portion CL2-2 positioned in the second lower layer 163.

In an exemplary embodiment, a width of the third portion CL2-1 may be substantially equal to a width of the first portion CL1-1. Further, a width of an upper end portion of the fourth portion CL2-2 may be substantially equal to the width W2 of the upper end portion of the second portion CL1-2, and a width of a lower end portion of the fourth portion CL2-2 may be substantially equal to the width W3 of the lower end portion of the second portion CL1-2.

However, if the front anti-reflection layer 130 and the back anti-reflection layer 160 are formed of different materials, the structure, the etching conditions, or a width of each portion of the first contact line CL1 may be different from a width of each portion of the second contact line CL2.

A contact surface between the second electrode 170 and the second upper layer 161 may be a substantially flat surface, and a contact surface between the second electrode 170 and the second lower layer 163 may be a curved surface.

The second electrodes 170 on the back surface of the back surface field layer 150 exposed through the second contact lines CL2 collect carriers (for example, electrons) moving to the substrate 110 and output the carriers to an external device.

The second electrode 170 may be formed of the same material as or a material different from the first electrode 140. The second electrode 170 may have the same width as the first electrode 140. Alternatively, the second electrode 170 may have a width greater than a width of the first electrode 140, so as to secure a line resistance.

The solar cell 100 may serve as a double-sided light receiving solar cell, and an operation of the solar cell 100 is described below.

When light irradiated onto the solar cell 100 is incident on the substrate 110 through the emitter layer 120 and/or the back surface field layer 150, a plurality of electron-hole pairs may be generated in the substrate 110 by light energy produced based on the light incident on the substrate 110. Because the front surface and the back surface of the substrate 110 may be a first textured surface 111 and a second textured surface 113, respectively, a light reflectance in each of the front surface and the back surface of the substrate 110 may be reduced. Further, because both a light incident operation and a light reflection operation may be performed on each of the first and second textured surfaces 111 and 113 of the substrate 110, light may be confined in the solar cell 100. Hence, a light absorption may increase and the efficiency of the solar cell 100 may be improved. In addition, because a reflection loss of the light incident on the substrate 110 may be reduced by the front and back anti-reflection layers 130 and 160, an amount of light incident on the substrate 110 may further increase.

The electron-hole pairs may be separated into electrons and holes by the p-n junction between the substrate 110 and the emitter layer 120, and the separated holes may move to the p-type emitter layer 120 and the separated electrons may move to the n-type substrate 110. The holes moving to the emitter layer 120 may move to the first electrodes 140, and the electrons moving to the substrate 110 may move to the second electrodes 170 through the back surface field layer 150. Accordingly, if the first electrodes 140 of one solar cell 100 are connected to the second electrodes 170 of an adjacent solar cell 100 using, for example, electric wires, current flows therein to thereby enable use of the current for electric power.

The solar cell 100 may be used when the solar cell 100 is positioned between a light transmission front substrate and a light transmission back substrate and is sealed by a protective layer.

A method for manufacturing the solar cell 100 may include forming the lower layer on the substrate 110 and forming the upper layer on the lower layer using a material different from the lower layer to form the insulating layer and patterning the insulating layer to form the opening. The patterning of the insulating layer may include performing the dry etching process using a laser on the upper layer and performing the wet etching process on the lower layer using the upper layer as a mask.

A method for manufacturing the solar cell 100 is described below.

Figure 3:
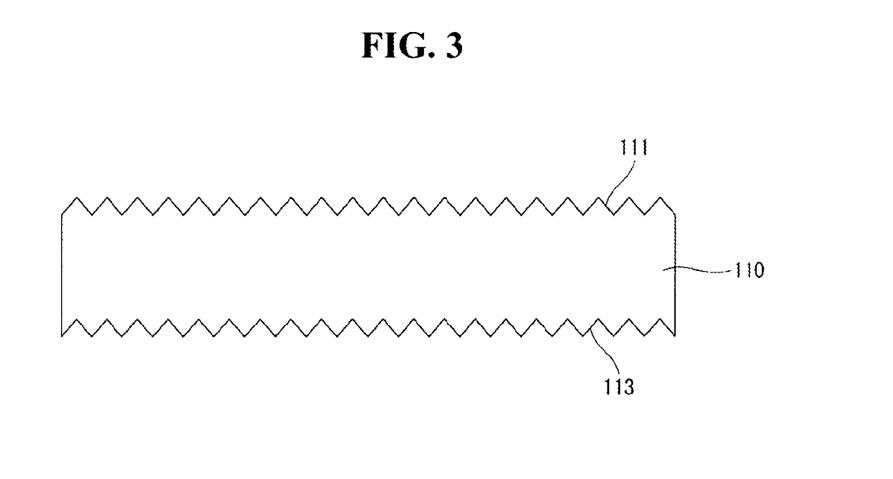
FIGS. 3 to 6 illustrate schematic cross-sectional views sequentially illustrating a method for manufacturing the semiconductor device shown in FIG. 1.

First, as illustrated in FIG. 3, the first textured surface 111 may be formed on the front surface of the substrate 110, and the second textured surface 113 may be formed on the back surface of the substrate 110.

The substrate 110 formed of silicon wafer may be manufactured by slicing a silicon block or an ingot using a blade or a multi-wire saw. The silicon wafer may be doped with impurities of a group V element, for example, phosphorus (P) to form an n-type semiconductor substrate as the substrate 110.

If the silicon block or the ingot is sliced, a mechanically damaged layer may be formed in the silicon wafer. Thus, a wet etching process for removing the mechanically damaged layer may be performed to remove the damaged layer, so as to prevent a reduction in characteristics of the solar cell 100 resulting from the mechanically damaged layer. An alkaline etchant or an acid etchant may be used in the wet etching process.

After the mechanically damaged layer is removed, the wet etching process or a dry etching process using plasma may be performed to form the first textured surface 111 in the front surface of the substrate 110 and to form the second textured surface 113 in the back surface of the substrate 110.

Figure 4:
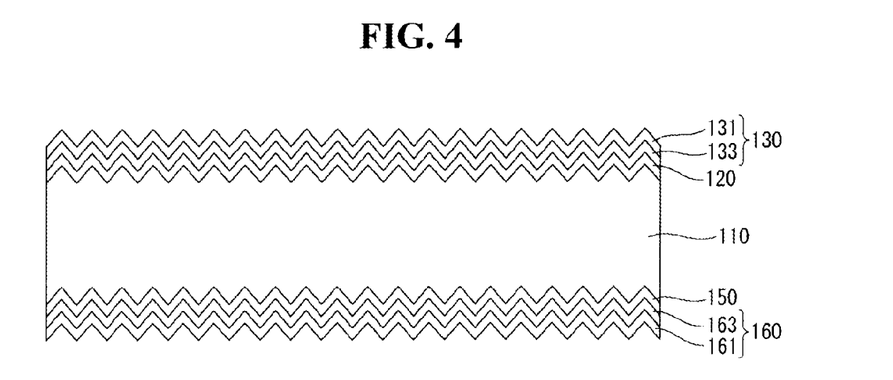

After the first and second textured surfaces 111 and 113 are formed, the front surface of the substrate 110 may be doped with impurities of a group III element to form the emitter layer 120. Further, the back surface of the substrate 110 may be doped with impurities of a group V element to form the back surface field layer 150.

Subsequently, a natural oxide layer may be removed by etching the substrate 110 using hydrofluoric acid (HF). The front anti-reflection layer 130 may be formed on the emitter layer 120, and the back anti-reflection layer 160 may be formed on the back surface of the back surface field layer 150.

The front anti-reflection layer 130 and the back anti-reflection layer 160 may be manufactured by depositing aluminum oxide or silicon oxide using, for example, a plasma enhanced chemical vapor deposition (PECVD) method or a sputtering method, or the lower layer may be formed and then silicon nitride may be deposited using, for example, the PECVD method or the sputtering method to form the upper layer.

Subsequently, a dry etching process using a laser is performed to remove a portion of the first upper layer 131 of the front anti-reflection layer 130 and a portion of the second upper layer 161 of the back anti-reflection layer 160. Hence, the first portion CL1-1 of the first contact line CL1 and the third portion CL2-1 of the second contact line CL2 may be formed.

In the dry etching process, a portion of the first upper layer 131 and the second upper layer 161 may be removed by applying a UV laser. If the first lower layer 133 and the second lower layer 163 are formed of aluminum oxide, which may have absorption coefficients or band gaps greatly different from silicon nitride, a portion of each of the first upper layer 131 and the second upper layer 161 may be removed by applying an UV laser having a wavelength of about 355 nm to the first upper layer 131 and the second upper layer 161 at a frequency corresponding to a bonding energy of silicon nitride.

Further, even if the first lower layer 133 and the second lower layer 163 are formed of silicon oxide in which there may be little difference between absorption coefficients or band gaps of silicon nitride and silicon oxide, the UV laser may be used to remove the first upper layer 131 and the second upper layer 161.

As above, if the dry etching process using the laser is performed to form the first portion CL1-1 of the first contact line CL1 and the third portion CL2-1 of the second contact line CL2, a damage resulting from the laser may be absorbed by the first lower layer 133 and the second lower layer 163. Thus, damage of the substrate 110 by the laser may be prevented.

Subsequently, a selective wet etching process may be performed on an exposed portion of each of the first lower layer 133 and the second lower layer 163 to remove the exposed portion. Hence, the second portion CL1-2 of the first contact line CL1 and the fourth portion CL2-2 of the second contact line CL2 are formed.

As above, if the first lower layer 133 and the second lower layer 163 are removed using the selective wet etching process, particles generated in the dry etching process may be removed. Therefore, a separate wet etching process for removing the particles may be omitted.

In the wet etching process an etchant capable of etching only a material or materials of each of the first lower layer 133 and the second lower layer 163 may be used or an etchant favoring etching of the material or materials of each of the first lower layer 133 and the second lower layer 163 may be used. For example, a buffered oxide etchant (BOE) capable of selectively etching silicon nitride and metal oxide-based material may be used.

In the above-described method, a width of a lower portion of the first electrode 140 positioned on the first contact line CL1 may be greater than a width of an upper portion thereof. Further, a width of a lower portion of the second electrode 170 positioned on the second contact line CL2 may be greater than a width of an upper portion thereof.

As described above, because the size of the electrode exposed to the outside of the anti-reflection layer may decrease, a contact area between the electrode and the emitter layer or the back surface field layer may increase while greatly suppressing a reduction in a light incident area resulting from the electrode.

Furthermore, the process removes a damaged portion generated by the laser and a separate wet etching process removes the particles is not necessary. Further, even if the laser is used, the damage of the substrate may be prevented.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device comprising:

forming a lower insulating layer on at least one of a front surface and a back surface of a substrate;

forming an upper insulating layer on the lower insulating layer; and forming an opening passing through the upper insulating layer and the lower insulating layer, wherein a maximum width of the opening at the lower insulating layer is greater than a maximum width of the opening at the upper insulating layer, and wherein the forming of the opening includes:

a first etching step of dry etching the upper insulating layer using a laser; and a second etching step of wet etching the lower insulating layer using the upper insulating layer as a mask.

2. The method of claim 1, wherein a width of the opening at a lower portion of the lower insulating layer is greater than a width of the opening at a lower portion of the upper insulating layer.

3. The method of claim 2, wherein a width of the opening at an upper portion of the lower insulating layer is greater than the width of the opening at the lower portion of the lower insulating layer.

4. The method of claim 3, wherein a side surface of the opening connecting the upper portion of the lower insulating layer to the lower portion of the lower insulating layer is in the form of a curved line.

5. The method of claim 2, wherein a width of the opening at an upper portion of the lower insulating layer is greater than the width of the opening at the lower portion of the upper insulating layer.

6. The method of claim 1, wherein the second etching step includes removing particles generated in the first etching step.

7. The method of claim 1, wherein the lower insulating layer and the upper insulating layer are formed only on the front surface of the substrate.

8. The method of claim 7, further comprising, before forming the lower insulating layer on the front surface of the substrate, forming an emitter layer at the front surface of the substrate.

9. The method of claim 8, further comprising, before forming the emitter layer at the front surface of the substrate, texturing the front surface of the substrate.

10. The method of claim 7, wherein the lower insulating layer is formed of aluminum oxide or silicon oxide, and the upper insulating layer is formed of silicon oxide.

11. The method of claim 1, wherein the lower insulating layer and the upper insulating layer are formed on both the front surface and the back surface of the substrate.

12. The method of claim 11, further comprising, before forming the lower insulating layer on the front surface of the substrate, forming an emitter layer at the front surface of the substrate.

13. The method of claim 12, further comprising, before forming the emitter layer at the front surface of the substrate, texturing the front surface of the substrate.

14. The method of claim 12, further comprising, before forming the lower insulating layer on the back surface of the substrate, forming a back surface field layer at the back surface of the substrate.

15. The method of claim 14, further comprising, before forming the back surface field layer at the back surface of the substrate, texturing the back surface of the substrate.

16. The method of claim 11, wherein the lower insulating layer on the front surface of the substrate and the lower insulating layer on the back surface of the substrate are simultaneously formed of the same material.

17. The method of claim 16, wherein the lower insulating layer on the front surface of the substrate and the lower insulating layer on the back surface of the substrate are formed of aluminum oxide or silicon oxide.

18. The method of claim 11, wherein the upper insulating layer on the front surface of the substrate and the upper insulating layer on the back surface of the substrate are simultaneously formed of the same material.

19. The method of claim 18, wherein the upper insulating layer on the front surface of the substrate and the lower insulating layer on the back surface of the substrate are formed of silicon nitride.

* * * * *